(12) United States Patent
Peters et al.

(10) Patent No.: US 8,873,226 B1
(45) Date of Patent: Oct. 28, 2014

(54) ELECTRONIC DEVICE HOUSING HAVING A LOW-DENSITY COMPONENT AND A HIGH-STIFFNESS COMPONENT

(75) Inventors: David E. Peters, San Jose, CA (US); Ross Kenneth Thayer, Santa Clara, CA (US); Jason Conrad Chamberlain, Campbell, CA (US); John Avery Howard, Palo Alto, CA (US)

(73) Assignee: Amazon Technologies, Inc., Reno, NV (US)

( * ) Notice: Subject to any disclaimer, the term of this patent is extended or adjusted under 35 U.S.C. 154(b) by 70 days.

(21) Appl. No.: 13/609,135

(22) Filed: Sep. 10, 2012

(51) Int. Cl.
*H05K 5/00* (2006.01)
*H05K 7/00* (2006.01)
*H05K 5/04* (2006.01)
*H05K 5/03* (2006.01)

(52) U.S. Cl.
CPC ... *H05K 5/04* (2013.01); *H05K 5/03* (2013.01)
USPC .................................................... 361/679.01

(58) Field of Classification Search
CPC .... C22C 1/08; B32B 17/04; B32B 2262/106; B32B 2307/54; B32B 2307/718; B32B 25/045; B32B 5/18; F41H 5/0457
USPC ............. 361/750, 751, 757, 760, 679.01; 312/223.1
See application file for complete search history.

(56) References Cited

U.S. PATENT DOCUMENTS

| | | | | | |
|---|---|---|---|---|---|
| 3,707,401 | A | * | 12/1972 | Jarema et al. | 428/312.2 |
| 3,839,080 | A | * | 10/1974 | Jarema et al. | 428/312.2 |
| 8,005,250 | B2 | * | 8/2011 | Josephson et al. | 381/355 |
| 8,324,515 | B2 | * | 12/2012 | Stevenson et al. | 174/565 |
| 8,640,867 | B2 | * | 2/2014 | Szucs et al. | 206/320 |
| 2007/0138041 | A1 | * | 6/2007 | Welsh | 206/349 |
| 2009/0095523 | A1 | * | 4/2009 | Stevenson et al. | 174/565 |
| 2013/0193005 | A1 | * | 8/2013 | Hoeth | 206/14 |
| 2013/0329173 | A1 | * | 12/2013 | Jung | 349/122 |
| 2014/0007983 | A1 | * | 1/2014 | Prest et al. | 148/403 |
| 2014/0028830 | A1 | * | 1/2014 | Kieffer et al. | 348/82 |

* cited by examiner

*Primary Examiner* — Lisa Lea Edmonds
*Assistant Examiner* — Keith Depew
(74) *Attorney, Agent, or Firm* — Lowenstein Sandler LLP

(57) ABSTRACT

An electronic device housing including a relatively thin and stiff support plate and including a relatively thick and low-density edge frame is described. The support plate may be composed of a composite material, such as carbon-fiber reinforced polymer or aluminum metal matrix composite, and the edge frame may be composed of a foam material, such as closed-cell aluminum foam.

19 Claims, 8 Drawing Sheets

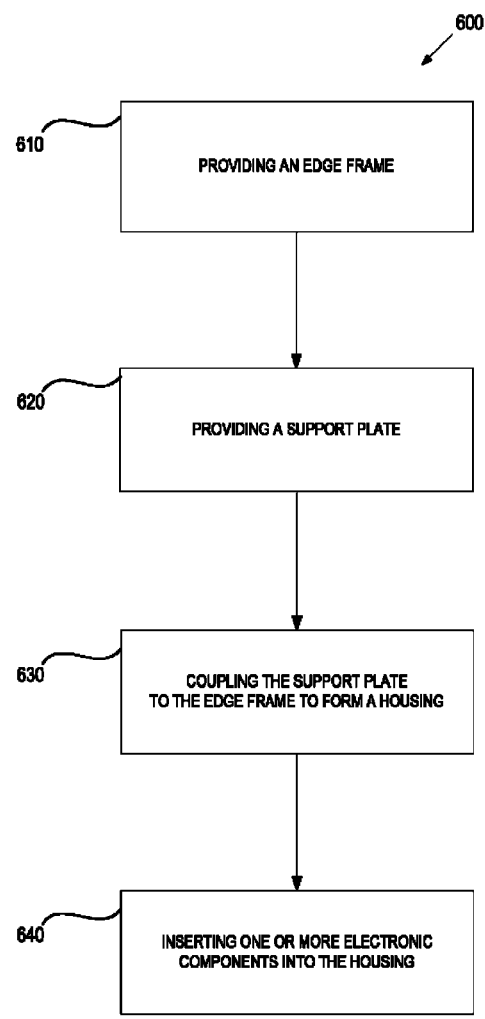

ELECTRONIC DEVICE HOUSING HAVING A LOW-DENSITY COMPONENT AND A HIGH-STIFFNESS COMPONENT

BACKGROUND

A large and growing population of users enjoy entertainment through the consumption of digital media items, such as music, movies, images, electronic books and so on. Users employ various electronic devices to consume such media items. Among these electronic devices are electronic book readers, cellular telephones, personal digital assistants (PDAs), portable media players, tablet computers, netbooks and the like.

These electronic devices often include a housing to protect internal electrical components of the electronic device. It can be difficult to design a housing that is both light and strong.

BRIEF DESCRIPTION OF THE DRAWINGS

The present invention will be understood more fully from the detailed description given below and from the accompanying drawings of various embodiments of the present invention, which, however, should not be taken to limit the present invention to the specific embodiments, but are for explanation and understanding only. Further, it should be understood that the drawings are not necessarily proportional or to scale.

FIG. 11 illustrates a flowchart of a method of forming an electronic device.

DETAILED DESCRIPTION

Embodiments of an electronic device housing having a low-density edge frame coupled with a high-stiffness support plate are described. For example, the edge frame may be composed of aluminum foam. Because the aluminum foam comprises aluminum, it provides the look and feel of aluminum. For example, like solid aluminum, the exterior surface of an aluminum foam edge frame has a metallic sheen and feels smooth and cool to the touch. However, the density of the aluminum foam is much less than solid aluminum. For example, aluminum foam may have a density of 0.6 grams per cubic centimeter (g/cc), whereas solid aluminum may have a density of 2.70 g/cc. Even though aluminum foam is low-density, it is still relatively stiff for its weight. In particular, the elastic modulus (sometimes referred to as Young's modulus) even exceeds that of polymers with higher density. For example, aluminum foam may have an elastic modulus of 4 to 5 gigapascals (GPa), whereas polymers with a density of 1.0 g/cc may only have an elastic modulus of 1 to 2 GPa. The support plate significantly increases the stiffness of the housing. The support plate may be composed of a composite material, such a carbon-fiber reinforced polymer or aluminum metal matrix composite. Each of these materials has a very high elastic modulus (between 65 and 150 GPa), but are also relatively low-density for their stiffness (between 2.0 g/cc and 3.5 g/cc). Combined, the edge frame and the support plate form a housing that is both lightweight and stiff.

Figure 1:
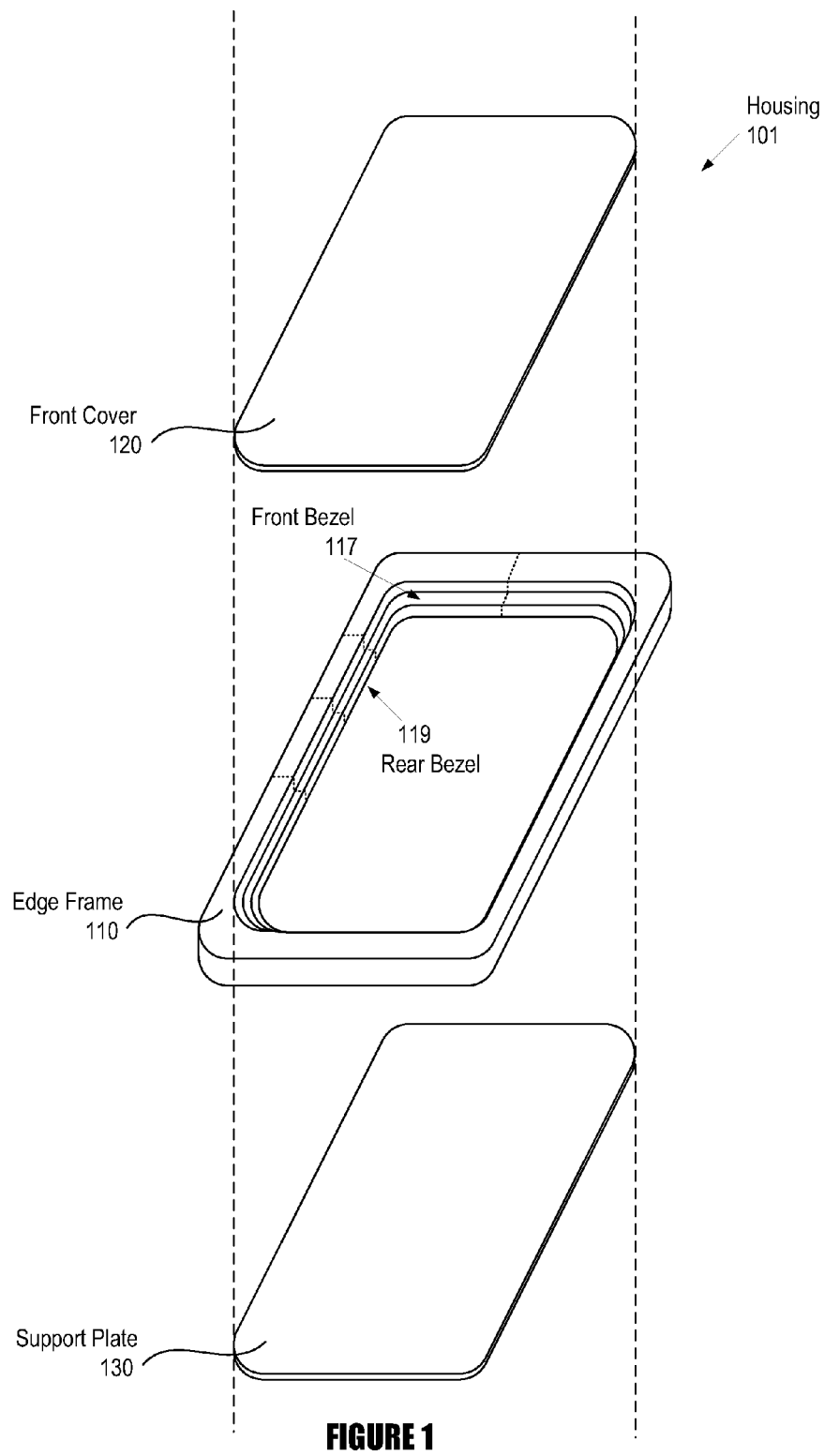
FIG. 1 illustrates an exploded perspective view of an embodiment of an electronic device housing.

FIG. 1 illustrates an exploded perspective view of an embodiment of an electronic device housing 101. The housing 101 includes an edge frame 110, a front cover 120, and a support plate 130. The edge frame 110 is illustrated with dashed lines to ease understanding of the perspective view.

When assembled, the front cover 120 rests upon a front bezel 117 of the edge frame 110 and is surrounded by the edge frame 110. The edge frame 110 may be also have a rear bezel 119 (not visible in the perspective view, but illustrated in, e.g. FIG. 5) upon which the support plate 130 rests. In one embodiment, the support plate 130 is also surrounded by the edge frame 110 when the support plate 130 rests on the rear bezel 119.

Whereas the front cover 120 and the support plate 130 are relatively thin, the edge frame 110 provides thickness to the housing 101. The edge frame 110 may be a lightweight material. For example, the edge frame 110 may have a density of less than 1.0 grams g/cc. As another example, the edge frame 110 may have a density of less than 0.8 g/cc, less than 0.6 g/cc or less than 0.5 g/cc. Thus, although the edge frame 110 provides thickness to the housing 101, it does not add substantial weight to the housing 101.

In one embodiment, the edge frame 110 is composed of foam. In particular, the edge frame 110 may be composed of metal foam, such as aluminum foam, magnesium foam or titanium foam. The edge frame 110 may be composed of other types of foam, such as cellulose foam, polymer foam, or styrene foam. The foam may be open-celled or closed-celled. The foam may be a reticulated foam or a syntactic foam. In one embodiment, the edge frame 110 is composed of a closed-cell aluminum foam having an average cell size of approximately 0.5 millimeters (mm) or less. Although aluminum foam may be advantageous because of its low density as compared to other materials, aluminum foam is also advantageous because of its relative stiffness in view of its lightweight. For example, aluminum foam is less dense than the lightest metals used in consumer electronic housings and is even less dense than polymer materials. Nevertheless, at this lower density, aluminum foam provides more stiffness than polymer materials. In particular, the elastic modulus of aluminum foam may exceed two or three times that of polymer materials unless the polymer is heavily infused with glass (and, therefore, more dense). Although the edge frame may be composed of aluminum foam, it is to be appreciated that the edge frame 110 may be composed of solid metal, plastic, glass or any other material.

The front cover 120 may be composed of glass. The front cover 120 may be also be composed of plastic or any other material. The front cover 120 may comprise a screen which can display text, images or other media. The screen may comprise a liquid crystal display (LCD), an electronic paper display, or any another type of display. For example, an electronic paper display may comprise a bi-stable LCD display, a microelectromechanical system (MEMS) display, a cholesteric display, an electrophoretic display, or another electronic paper display. One exemplary electronic paper display that may be used is an E Ink-brand display. The front cover 120 may also comprise a touchpad which can receive input from a user. In one embodiment, the front cover 120 comprises a touchscreen.

In one embodiment, the support plate 130 is, like the front cover 120, surrounded by the edge frame 110. Whereas the edge frame 110 may be a lightweight material and may not provide enough stiffness and durability to the housing 101 to prevent deformation during rigorous consumer use, the support plate 130 provides additional stiffness to the housing 101. For example, the support plate 130 may have an elastic modulus of 50 gigapascals (GPa) or greater. As another example, the support plate 130 may have an elastic modulus that is 90 GPa or greater.

For comparison, it is noted that the elastic modulus of aluminum foam may be between 4 and 10 GPa. Thus, the support plate 130 may have an elastic modulus that is much higher than the edge frame 110. However, the support plate 130 may also have a density that is greater than that of the edge frame 110. For example, the density of aluminum foam may be between 0.4 g/cc and 0.8 g/cc, whereas the support plate 130 may have a density between 1.5 g/cc and 2.5 g/cc or higher.

In one embodiment, the support plate 130 is composed of a composite material. In one embodiment, the support plate 130 is composed of fiber reinforced polymer, such as glass-fiber reinforced polymer (GFRP), carbon-fiber reinforced polymer (CFRP) or aramid-fiber reinforced polymer (AFRP). The aramid-fiber may include Kevlar, Twaron, Nomex, para-aramids, or other materials. In another embodiment, the support plate 130 is composed of a metal matrix composite, such as aluminum metal matrix composite (Al-MMC), magnesium metal matrix composite (Mg-MMC), titanium metal matrix composite (Ti-MMC) or copper metal matrix composite (Cu-MMC). The support plate 130 may be composed of other composite materials or other non-composite materials.

Figure 2:
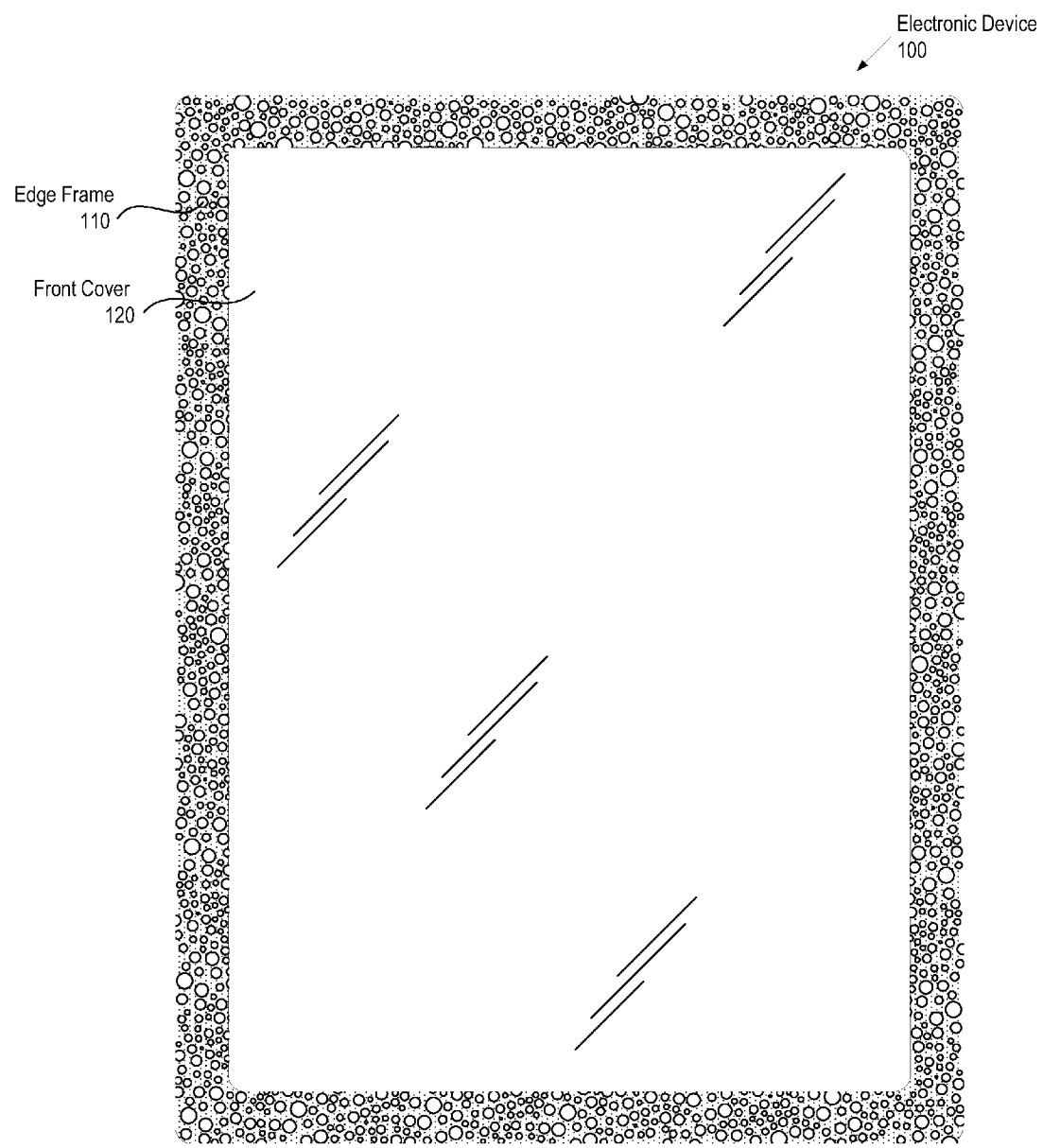
FIG. 2 illustrates a front view of an embodiment of an electronic device.
Figure 3:
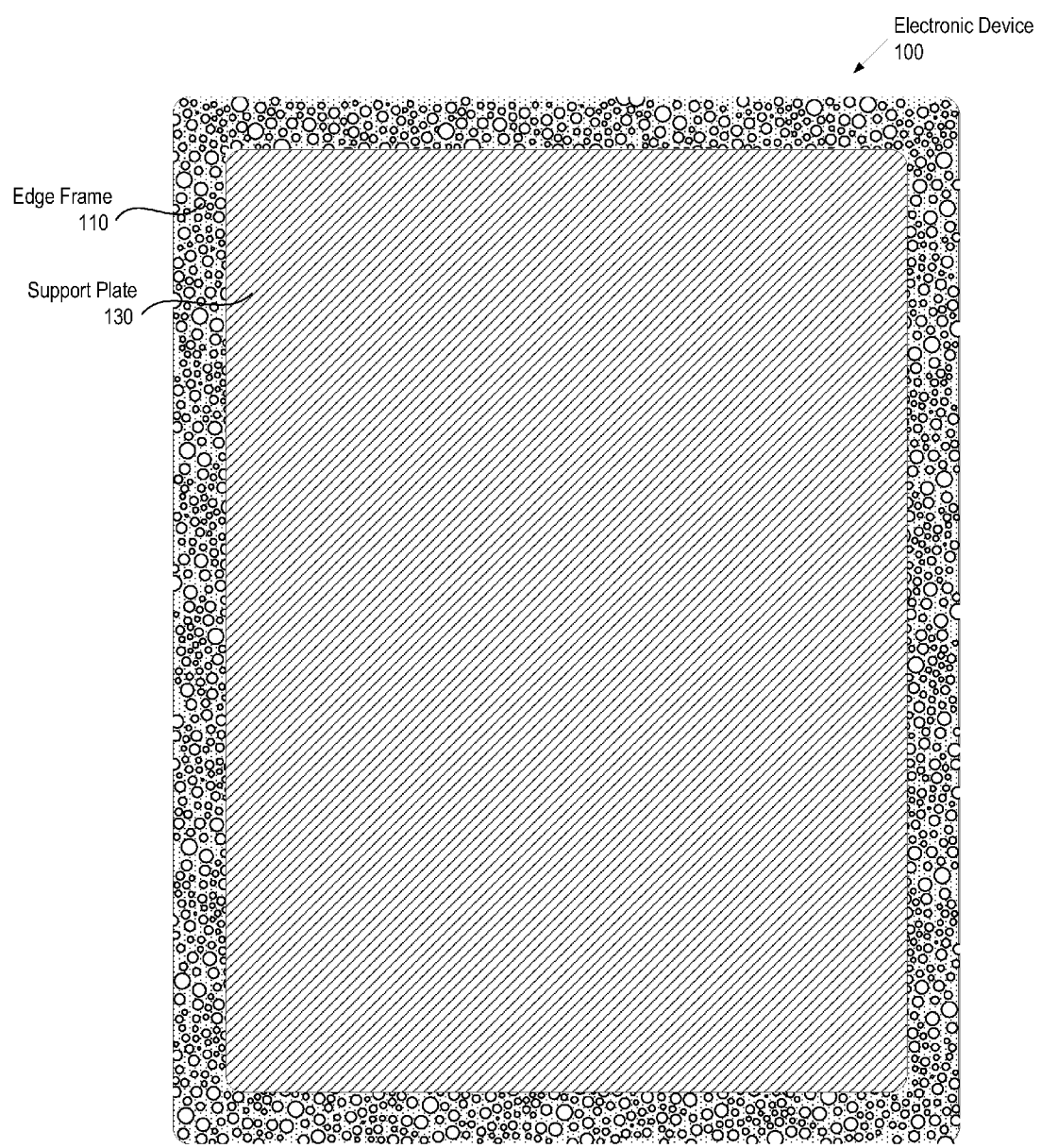
FIG. 3 illustrates a rear view of an embodiment of an electronic device.

FIG. 2 illustrates a front view of an embodiment of an electronic device 100. FIG. 3 illustrates a rear view of the electronic device 100. The electronic device 100 may include an electronic book reader, a cellular telephone, a personal digital assistant (PDAs), a portable media player, a tablet computer, a netbook or any portable, compact electronic device.

The electronic device 100 includes a housing 101 that houses and protects a number of internal electronic components that provide various functionality to the electronic device 100. The housing 101 includes an edge frame 110, a front cover 120, and a support plate 130 as described above with respect to FIG. 1. The edge frame 110 is illustrated as a foam having a number of cells. In one embodiment, the foam is an open-celled foam. In another embodiment, the foam is a closed-cell foam. Although the FIGS. illustrate cells of a particular size, shape, density, and distribution it is to be appreciated that the drawings are not necessarily to scale and that the cells of the foam may be any size, shape, density, or distribution.

Figure 4:
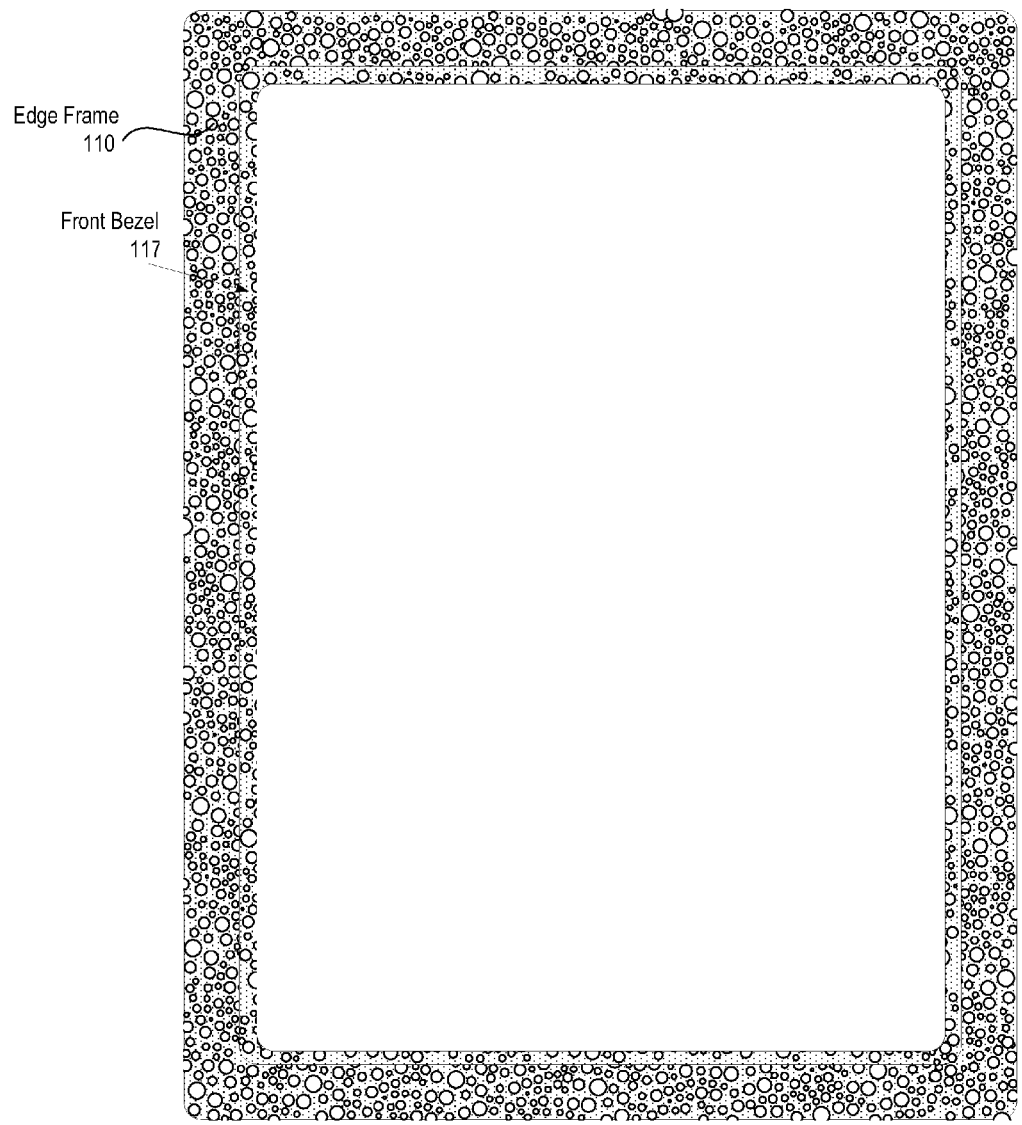
FIG. 4 illustrates a front view of an embodiment of an edge frame of an electronic device housing.

FIG. 4 illustrates a front view of an embodiment of an edge frame 110 of an electronic device housing 101. The edge frame 110 includes a recessed front bezel 117 upon which the front cover 120 is set. Although not visible from the front view of FIG. 3, but visible from the cross-section of FIG. 5, the edge frame 110 may further comprise a recessed rear bezel 119 upon which the support plate 130 is set.

Although the edge frame 110 of FIG. 4 is illustrated as a closed rectangular shape with rounded corners, other shapes are possible. For example, the edge frame 110 may be any closed shape, such as a square, a circle, a triangle or an irregular shape. The edge frame 110 may have sharp or rounded corners. The edge frame 110 may be an open shape, such as a U-shape which only surrounds the front cover 120 on three sides. The edge frame 110 may be composed of multiple discontinuous regions. For example, the edge frame 110 may have four portions that surround the front cover 120 on four sides, but not at the corners. The edge frame 110 may be any shape.

Figure 5:
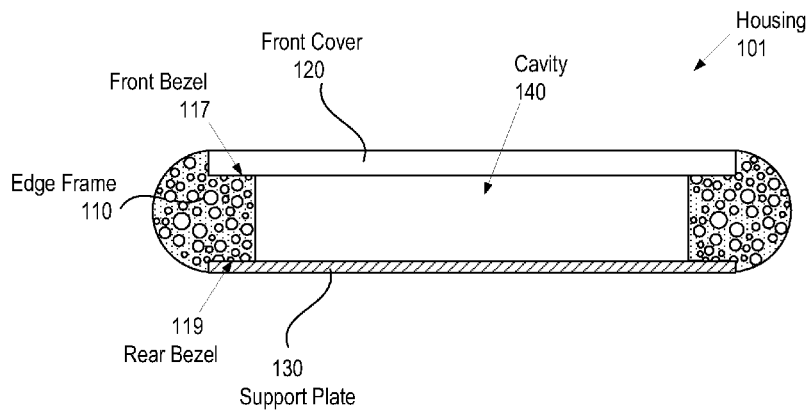
FIG. 5 illustrates a cross-sectional side view of an embodiment of an electronic device housing.

FIG. 5 illustrates a cross-sectional side view of the housing 101. The housing 101 includes an edge frame 110 that couples and defines a cavity 140 between a front cover 120 and a support plate 130. The edge frame 110 includes a front bezel 117 upon which the front cover 120 is set and a rear bezel 119 upon which the support plate 130 is set.

Figure 6:
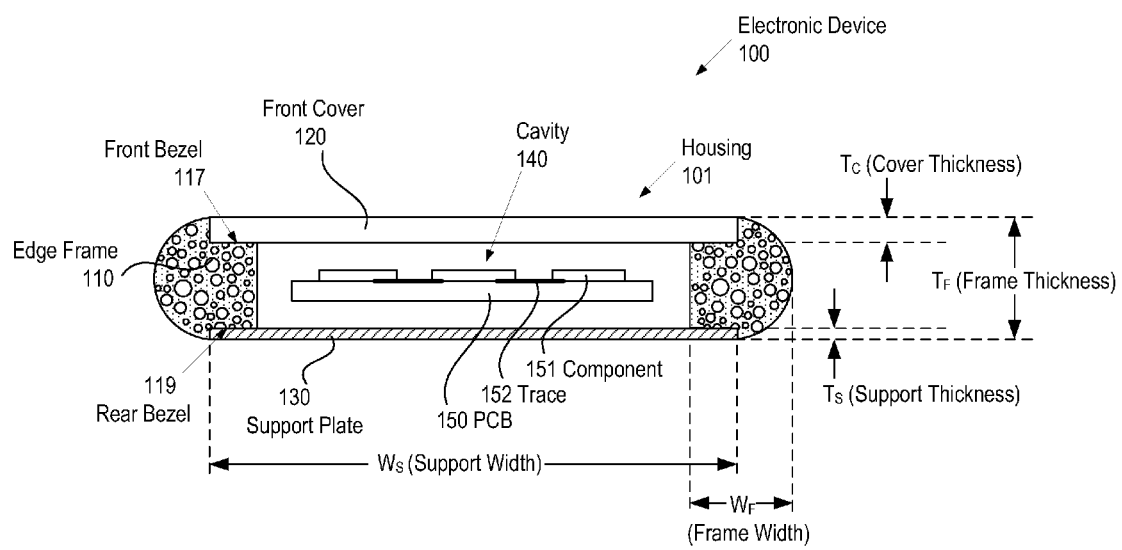
FIG. 6 illustrates a cross-sectional side view of an embodiment of an electronic device.

FIG. 6 illustrates a cross-sectional side view of an embodiment of an electronic device 100. The electronic device 100 includes the housing 101 of FIG. 5 and electronic components disposed within the cavity 140 defined by the housing 101. The electronic components may include, for example, a printed circuit board (PCB) 150 having components 151 disposed thereon and coupled by one or more conductive traces 152. The components 151 may include, for example, a resistor, a switch, a diode, a battery, a processor, a memory or any of other component.

FIG. 6 also illustrates certain dimensions of the housing components. In particular, a thickness ($T_S$) of the front cover 120, a thickness ($T_S$) of the support plate 130, a width ($W_S$) of the support plate 130, a thickness ($T_F$) of the edge frame 110 and a width ($W_F$) of the edge frame 110 are shown.

In one embodiment, the support plate 130 is fundamentally two-dimensional. For example, the width ($W_S$) of the support plate 130 may be much greater than the thickness ($T_S$) of the support plate 130. As an example, the width ($W_S$) may be at least 10 times greater than the thickness ($T_S$). As an example, the width ($W_S$) may be at least 50 times greater than the thickness ($T_S$). As another example, the width ($W_S$) may be at least 100 times greater than the thickness ($T_S$). In one embodiment, the thickness ($T_S$) of the support plate 130 may be 1.0 mm or less. In one embodiment, the thickness ($T_S$) may be 0.6 mm or less. In one embodiment, the thickness ($T_S$) may be 0.5 mm or less.

In contrast to the thinness of the support plate 130, the edge frame 110 may be relatively thick. For example, the thickness ($T_F$) of the edge frame 110 may be at least 10 times greater than the thickness ($T_S$) of the support plate 130. As another example, the thickness of the edge frame 110 may be at least 20 times greater than the thickness ($T_S$) of the support plate 130.

In contrast to the flatness of the support plate 130, the edge frame 110 may be fundamentally three-dimensional. For example, the width ($W_F$) of the edge frame 110 may be the same order of magnitude as the thickness ($T_F$) of the edge frame 110. As an example, the thickness ($T_F$) of the edge frame 110 may be greater than a quarter the width ($W_F$) of the edge frame 110. As another example, the thickness ($T_F$) of the edge frame 110 is greater than half the width ($W_F$) of the edge frame 110. In one embodiment, the thickness ($T_F$) of the edge frame 110 is greater than the width ($W_F$) of the edge frame 110. In one embodiment, the thickness ($T_F$) of the edge frame 110 is greater than twice the width ($W_F$) of the edge frame 110. In one embodiment, the thickness ($T_F$) and width ($W_F$) of the edge frame may be between approximately 5 mm and 10 mm. In one embodiment, the thickness ($T_F$) of the edge frame is at least five times the thickness ($T_S$) of the support plate.

The front cover 120 may also be fundamentally two-dimensional, but thicker than the support plate 130. For example, the thickness ($T_C$) of the front cover 120 may be greater than 5 times the thickness ($T_S$) of the support plate 130. As another example, the thickness ($T_C$) of the front cover 120 may be greater than 10 times the thickness ($T_S$) of the support plate 130. In one embodiment, the thickness ($T_C$) of the front glass is approximately 3 mm.

The support plate 130 is, in one embodiment, composed of a stiff composite material. Thus, the support plate 130 provides strength and durability to the housing 101. However, the composite material may be difficult to form into non-flat or fundamentally three-dimensional shapes. Thus, in one embodiment, the edge frame 110 is composed of foam. A foam edge frame 110 provides thickness to the housing 101 without substantial additional weight. In comparison to the support plate 130, the edge frame 110 may not be stiff. However, in conjunction with the support 130, the edge frame 110 forms a housing 101 that is strong, durable and lightweight.

As compared to each other, the support plate 130 may be relatively flat and stiff and the edge frame 110 may be relatively non-flat and deformable. For example, the support plate 130 may have an elastic modulus that is at least 5 times greater than the elastic modulus of the edge frame 110. As another example, the support plate 130 may have an elastic modulus that is at least 10 times greater than the elastic modulus of the edge frame. As another example, the support plate 130 may have an elastic modulus that is at least 20 times greater than the elastic modulus of the edge frame. For example, as noted above, the elastic modulus of the support plate 130 may be 50 GPa or greater or 90 GPa or greater.

In one embodiment, the edge frame 110 is less dense than the support plate 130. For example, the density of the edge frame 110 may be less than half the density of the support plate 130 or less than a quarter the density of the support plate 130.

As mentioned above, the edge frame 110 and support plate 130 may be composed of glass, plastic, metal, foam, composite materials or any other kind of material. Properties of various materials that could be used for the edge frame 110 and support plate 130 are discussed below. Different materials provide different weight and stiffness to the housing 101. In one embodiment the edge frame 110 and support plate 130 are composed of different materials. By using different materials for the edge frame 110 and the support plate 130, a housing 101 that is both lightweight and durable can formed. In other embodiments, the edge frame 110 and support plate 130 may be formed of the same material. In one embodiment, the edge frame 110 and support plate 130 are formed as one piece, a single piece of homogenous material.

Closed-cell aluminum foam having a cell size of approximately 0.5 mm can be formed with a density between 0.4 g/cc and 0.8 g/cc with an elastic modulus between 4 and 10 GPa. Polymers may be formed with a density of approximately 1.0 g/cc with an elastic modulus of about 1 to 2 GPa. Solid magnesium has a density of approximately 1.74 g/cc and an elastic modulus of approximately 45 GPa. Solid aluminum has a density of approximately 2.70 g/cc and an elastic modulus of approximately 70 GPa. Steel has a density between approximately 7.75 g/cc and 8.05 g/cc and an elastic modulus between approximately 200 GPa. Thus, closed-cell aluminum foam can be formed with a density that is less than a polymer material, while still providing an elastic modulus that is at least two to three times greater. Although closed-cell aluminum foam has an elastic modulus that is much less than other metals, it is also much less dense.

Plastic may be formed with a density of approximately 1.1 g/cc with an elastic modulus of about 2 GPa. Plastic may also be formed with a density of approximately 1.5 g/cc with an elastic modulus between 15 GPa and 20 GPa. Glass has a density between 2 g/cc and 3 g/cc and has an elastic modulus between 50 and 90 GPa. Thus, aluminum foam can be formed with a density that is less than lightweight plastic, while still providing an elastic modulus that is at least two to three times greater. Although closed-cell aluminum foam has an elastic modulus that is less than heavy plastic or glass, it is also less dense.

Aramid-fiber reinforced polymer material may be formed with a density of approximately 1.5 g/cc and an elastic modulus between 30 and 35 GPa. Carbon-fiber reinforced polymer material may be formed with a density of approximately 2.0 g/cc and an elastic modulus between approximately 65 and 70 GPa. Glass-fiber reinforced polymer material may be formed with a density of approximately 2.5 g/cc and an elastic modulus between approximately 70 GPa and 90 GPa. Aluminum metal matrix composite material may be formed with a density of approximately 2.8 g/cc and an elastic modulus between approximately 100 GPa and 150 GPa. Composite materials, such as those described above, although more dense than, e.g., aluminum foam, each provides a much higher elastic modulus. Further, as compared to other materials with a high elastic modulus, such as steel, the density is much less.

Figure 7:
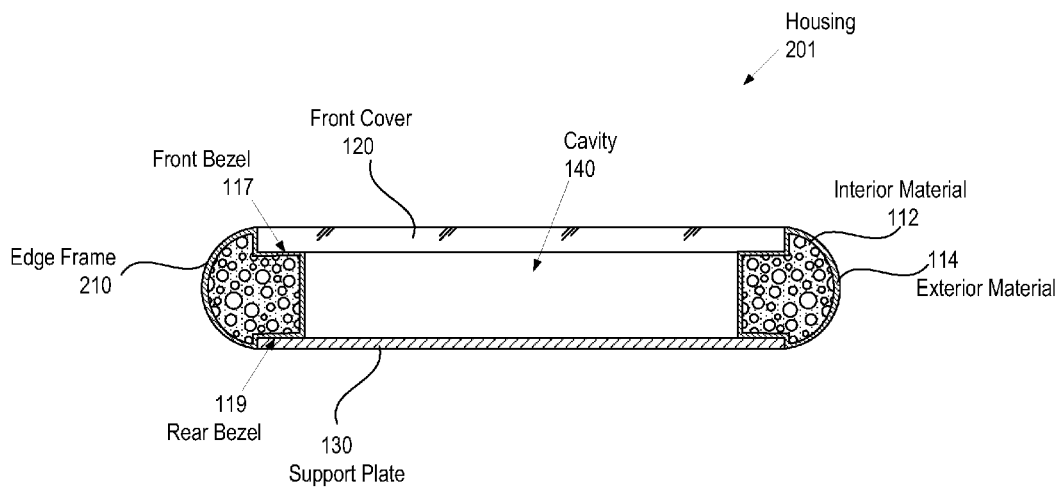
FIG. 7 illustrates a cross-sectional side view of an embodiment of an electronic device housing having an edge frame composed of multiple materials.

FIG. 7 illustrates a cross-sectional side view of an embodiment of an electronic device housing 201 having an edge frame 210 composed of multiple materials. The housing 201 is substantially similar to the housing 101 of FIG. 4; however, the edge frame 210 includes an interior portion composed of an interior material 112 and an exterior portion composed of an exterior material 114. The interior material 112 may be a low-density material, such as foam, whereas the exterior material 114 may provide desired aesthetic properties. For example, the exterior material 114 may be a finishing film or chrome. In another embodiment, the interior material 112 and the exterior material 114 may be the same substance with different properties. For example, the interior material 112 may be aluminum foam and the exterior material 114 may be a skin of solid aluminum. Such an edge frame 210 may be created using a powder metallurgy process in which aluminum powder is mixed with a foaming agent, placed into a three-dimensional mold, heated and compressed. The compression creates a casting skin having different properties than the material interior to the mold.

The exterior material 114 may provide a smooth outer surface not present in the interior material 112. For example, as shown in FIG. 7, the interior material 112, as an open-celled or closed-celled foam, may include cells that intersect the outer edge of the interior material 112 resulting in surface irregularities. The exterior material 114 may cover these irregularities.

Although, illustrated as such in FIG. 7, the exterior material 114 need not completely cover the interior material 112. In one embodiment, the exterior material 114 comprises less than 10% of the edge frame 210. In one embodiment, the exterior material is less than 1 mm thick.

Figure 8:
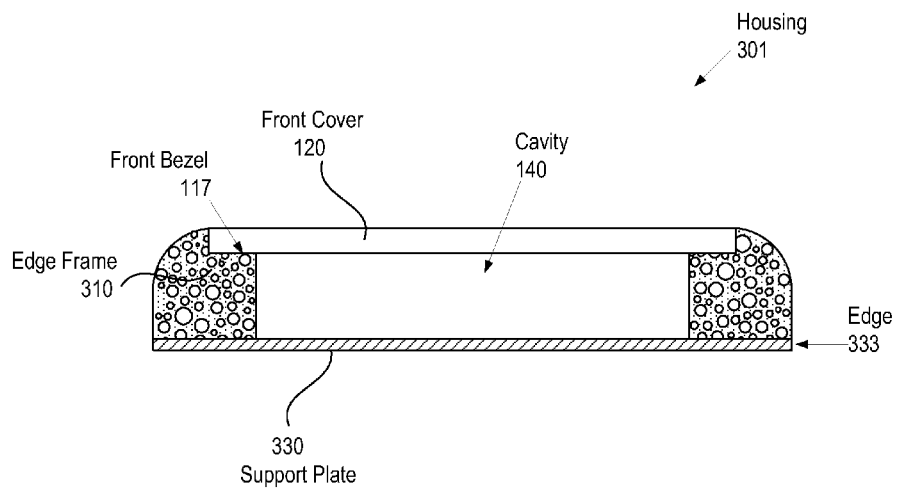
FIG. 8 illustrates a cross-sectional side view of an embodiment of an electronic device housing having a device-spanning support plate.

FIG. 8 illustrates a cross-sectional side view of an embodiment of an electronic device housing 301 having a device-spanning support plate 330. The housing 301 is substantially similar to the housing 101 of FIG. 4; however, the support plate 330 spans the entire rear of the housing 301. Thus, rather than being set on a rear bezel of the edge frame 310, the support plate 330 is attached to the rear of the edge frame 310. Further, rather than being surrounded by the edge frame 310, the support plate is coupled to an external surface of the edge frame 310. Thus, unlike in FIG. 5, where a circumscribing edge of the support plate, an edge that runs all the way around the support plate, contacts the edge frame, in FIG. 8, the edges 333 of the support plate are exposed.

Figure 9:
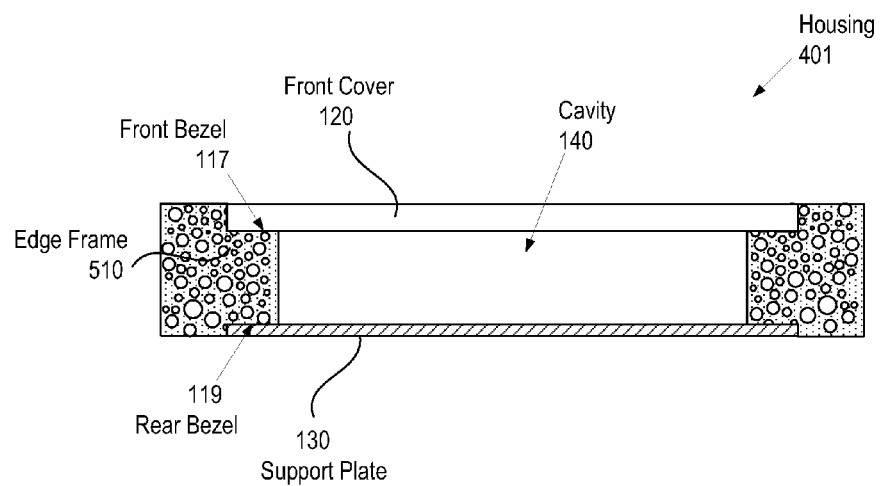
FIG. 9 illustrates a cross-sectional side view of an embodiment of an electronic device housing having an edge frame with flat external surfaces.

FIG. 9 illustrates a cross-sectional side view of an embodiment of an electronic device housing 401 having an edge frame 410 with flat external surfaces. The housing 401 is substantially similar to the housing 101 of FIG. 4; however, the edge frame 410 has flat external surfaces, rather than rounded external surfaces as illustrates by the housing 101 of FIG. 4. The edge frame 410 may have other external shapes.

Figure 10:
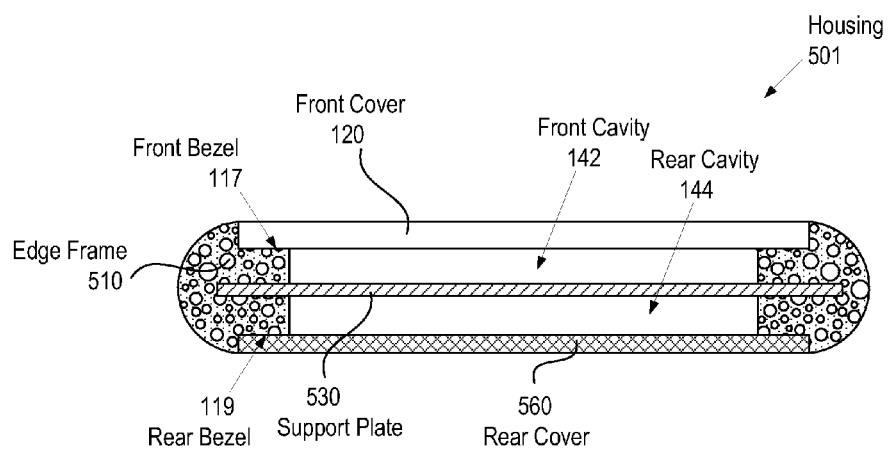
FIG. 10 illustrates a cross-sectional view of an embodiment of an electronic device housing having a support plate and a rear cover.

FIG. 10 illustrates a cross-sectional view of an embodiment of an electronic device housing 501 having a support plate 530 and a rear cover 560. The housing 501 is substantially similar to the housing 101 of FIG. 4; however, the support plate 530 is interior to the housing 501 and a rear cover 560 is set upon the rear bezel 119. The support plate 530 is inset into the edge frame 510 and may be wider than the rear cover 560. The support plate 530 defines a front cavity 142 and a rear cavity 144. The support plate 530 may have through-holes by which the front cavity 142 and the rear cavity 144 are coupled.

FIG. 11 illustrates a flowchart of a method of forming an electronic device. The method 600 begins, in block 610, by providing a edge frame. The edge frame may be, for example, the edge frame 110 of FIG. 1. The edge frame may be lightweight and relatively elastic. In one embodiment, the edge frame has a thickness of 5 millimeters or greater, an elastic modulus between 3 GPa and 15 GPa, and a density of 0.8 g/cc or less. In one embodiment, the edge frame is composed of foam, such as closed-cell aluminum foam. Closed-cell aluminum foam may be created by injecting a gas or mixing a foaming agent, such as titanium hydride ($TiH_2$) into molten aluminum. The foam may have an average cell size of approximately 0.5 mm or less. The foam may have a median cell size of approximately 0.5 mm or less. The edge frame may be composed of other materials.

In block 620, a support plate is provided. The support plate may be, for example, the support plate 130 of FIG. 1. The support plate may be relatively flat and stiff. In one embodiment, the support plate has a thickness of 1 millimeter or less and an elastic modulus of 50 GPa or greater. In one embodiment, the support plate is composed of a composite material, such as carbon-fiber reinforced polymer or aluminum metal matrix composite. A composite material may be formed by embedding a reinforcement material into a matrix or resin. In one embodiment, the support plate is formed by cutting or punching a shape from a sheet of composite material. The support plate may be composed of other materials.

In block 630, the support plate is coupled to the edge frame to form a housing. The support plate may be coupled to the edge frame by applying an adhesive between the support plate and the edge frame and adjoining the support plate to edge frame. The support plate may be coupled to the edge frame by brazing the support plate to the edge frame. Thus, the support plate and the edge frame may be adjoined and molten metal drawn between them via capillary action. The support plate may be coupled to the edge frame by thermal bonding. The support plate and the edge frame may be coupled using a fastener, such as a screw or bolt. The support plate and the edge frame may be coupled mechanically via an interference fit. The support plate and the edge frame may be coupled by other methods. Forming the housing may include other steps and the housing may include other portions. For example, the housing may further include a front cover.

In block 640, one or more electronic components are inserted into the housing. The electronic components may include, for example, a printed circuit board, conductive traces, a resistor, a switch, a diode, a battery, a processor, a memory or any other component. It is to be appreciated that the steps referred to in blocks 630 and 640 may be performed simultaneously or overlapping. For example, the support plate may be coupled to the edge frame, the one or more electronic components inserted and the housing completed by a front cover or other housing components.

The foregoing description sets forth numerous specific details such as examples of specific systems, components, methods and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of embodiments of the present invention.

In the above description, numerous details are set forth. It will be apparent, however, to one of ordinary skill in the art having the benefit of this disclosure, that embodiments of the present invention may be practiced without these specific details. In some instances, well-known structures and devices are shown in block diagram form, rather than in detail, in order to avoid obscuring the description.

It is to be understood that the above description is intended to be illustrative and not restrictive. Many other embodiments will be apparent to those of skill in the art upon reading and understanding the above description. The scope of the present invention should, therefore, be determined with reference to the appended claims, along with the full scope of equivalents to which such claims are entitled.

What is claimed is:

1. An electronic device comprising:
   one or more electronic components;
   a housing surrounding the electronic components, wherein the housing comprises:
   an edge frame composed of a low-density material comprising a closed-cell aluminum foam material;
   a support plate composed of a high-stiffness material comprising a composite material, wherein the edge frame surrounds the support plate and is coupled to the support plate to have the high-stiffness material of the support plate provide stiffness to the housing and prevent deformation of the edge frame; and
   a front cover comprising glass, wherein the edge frame surrounds the front cover and is coupled to the front cover.

2. The electronic device of claim 1, wherein the front cover contacts a front bezel of the edge frame and the support plate contacts a rear bezel of the edge frame.

3. The electronic device of claim 1, wherein the low-density material has a density of less than 0.8 grams per cubic centimeter and the high-stiffness material has an elastic modulus of greater than 50 gigapascals.

4. An electronic device housing comprising:
   a support plate comprising a composite material;
   a front cover comprising glass; and an edge frame comprising a foam material, wherein the edge frame surrounds the support plate and the front cover and is coupled to the support plate and the front cover.

5. The electronic device housing of claim 4, wherein a width of the support plate is at least ten times as great as a thickness of the support plate and wherein a thickness of the edge frame is at least five times a thickness of the support plate.

6. The electronic device housing of claim 4, wherein the composite material of the support plate comprises carbon-fiber reinforced polymer.

7. The electronic device housing of claim 4, wherein the composite material of the support plate comprises an aluminum metal matrix composite.

8. The electronic device housing of claim 4, wherein the support plate has a thickness of 1.0 millimeters or less.

9. The electronic device housing of claim 4, wherein the composite material of the support plate has an elastic modulus of at least 50 gigapascals.

10. The electronic device housing of claim 4, wherein the foam material of the edge frame comprises closed-cell metallic foam.

11. The electronic device housing of claim 10, wherein the foam material of the edge frame comprises aluminum foam.

12. The electronic device housing of claim 4, wherein the foam material of the edge frame has a density of less than 0.8 grams per cubic centimeter.

13. The electronic device housing of claim 4, wherein the edge frame comprises an interior portion composed of the foam material and an exterior portion at least partially surrounding the interior portion.

14. The electronic device housing of claim 4, wherein the edge frame surrounds the support plate such that a circumscribing edge of the support plate contacts the edge frame.

15. The electronic device housing of claim 14, wherein the support plate is disposed upon a bezel of the edge frame.

16. An electronic device housing comprising:
   a support plate having an elastic modulus of 50 gigapascals or greater;
   a front cover comprising glass; and
   an edge frame having an elastic modulus between 3 gigapascals and 15 gigapascals and a density of 0.8 grams per cubic centimeter or less, wherein the edge frame surrounds the support plate and the front cover and is coupled to the support plate and the front cover.

17. The electronic device housing of claim 16, wherein the support plate has a thickness of 1 millimeter or less and the edge frame has a thickness of 5 millimeters or greater.

18. The housing of claim 16, wherein the support plate comprises a composite material and the edge frame comprises a closed-cell foam material.

19. The housing of claim 16, wherein the edge frame comprises aluminum foam and the support plate comprises at least one of carbon-fiber reinforced polymer or aluminum metal matrix composite.

* * * * *